(12) United States Patent
Hirata et al.

(10) Patent No.: US 8,222,536 B2
(45) Date of Patent: Jul. 17, 2012

(54) WIRING SUBSTRATE

(75) Inventors: Shuzo Hirata, Tokyo (JP); Akinobu Ono, Tokyo (JP)

(73) Assignee: Fujikara Ltd., Tokyo (JP)

( * ) Notice: Subject to any disclaimer, the term of this patent is extended or adjusted under 35 U.S.C. 154(b) by 837 days.

(21) Appl. No.: 12/324,516

(22) Filed: Nov. 26, 2008

(65) Prior Publication Data

US 2009/0139748 A1      Jun. 4, 2009

Related U.S. Application Data

(63) Continuation of application No. PCT/JP2007/060844, filed on May 28, 2007.

(30) Foreign Application Priority Data

May 29, 2006   (JP) .................................. 2006-148722

(51) Int. Cl.
 *H05K 1/11*   (2006.01)
(52) U.S. Cl. ........................................ 174/261; 174/267
(58) Field of Classification Search .................. 174/261, 174/267; 361/772–779
See application file for complete search history.

(56) References Cited

U.S. PATENT DOCUMENTS

| | | | | |
|---|---|---|---|---|
| 6,396,707 | B1 * | 5/2002 | Huang et al. | ................... 361/760 |
| 6,911,604 | B2 * | 6/2005 | Tsai et al. | ...................... 174/255 |
| 7,189,927 | B2 * | 3/2007 | Sakuyama | ..................... 174/261 |

FOREIGN PATENT DOCUMENTS

| | | |
|---|---|---|
| JP | 06-132057 A | 5/1994 |
| JP | 2001-077494 A | 3/2001 |
| JP | 2003-216055 A | 7/2003 |
| JP | 2004-079811 A | 3/2004 |

* cited by examiner

*Primary Examiner* — Jeremy Norris
(74) *Attorney, Agent, or Firm* — Sughrue Mion, PLLC

(57) ABSTRACT

A wiring substrate is provided with a substrate, a conductive circuit formed on a surface of the substrate, and an insulating layer which covers the conductive circuit. In a fitting portion of the wiring substrate, the insulating layer is formed with an opening portion through which a portion of the conductive circuit is exposed or displayed as an exposed surface. On the exposed surface of the conductive circuit, an electrode layer is formed which is made of a conductive member. A bottom surface of the electrode layer is connected to the conductive circuit. An upper surface of the electrode layer is extended in the widthwise direction W of wirings of the conductive circuit so as to cover even a part of the insulating layer.

16 Claims, 7 Drawing Sheets

WIRING SUBSTRATE

TECHNICAL FIELD

The present invention relates to a wiring substrate that is provided with a fitting portion for connection with a connector.

BACKGROUND ART

A fitting portion for connecting a wiring substrate with a connector of another device conventionally has a structure in which a portion of conductive circuits that are formed on one surface of the substrate are exposed, with contact points of the connector side brought into contact with the exposed portions of the conductive circuits to be electrically connected, as shown in FIG. 8A and FIG. 8B. In the fitting portion of this wiring substrate 91, in addition to reducing the diameter of the connection by miniaturization and thinning of the device, fine pitching of the conductive circuits 92 is increasingly progressing.

However, there is a risk of easily causing electrical faults between adjacent conductive circuits by narrowing the wiring interval of the conductive circuits 92 and fine pitching of the conductive circuits 92 and the portions 92a that make contact with the contact point of the connector.

Also, when the size of the conductive circuit at the portion that makes contact with the contact point of the connector is reduced and fine pitching of the conductive circuits is performed, then as shown in FIG. 9 if a shift occurs in which the connectors 86 move slightly in the wiring width direction W, the disadvantage easily occurs in which each connector 86 separates from the exposed surface 83a of the conductive circuit 83, and so an electrical connection cannot be made between the connectors 86 and the conductive circuits 83.

Also, in the case of the constitution of FIG. 8A, there is known a wiring substrate that is provided with a covering layer 105 that is formed by coating a migration resistant resin (a paste material) on the outer periphery of a printed circuit portion 102 that is formed on the upper surface of a wiring substrate 101 in order to suppress migration resistance, as shown in FIG. 10. In the case of this substrate structure, when fine pitching is performed, due to the accuracy of the printing, there is a risk of the side surface portion of the printed circuit being exposed because a sufficient covering layer cannot be formed. When the printing circuit is exposed, migration readily occurs, which becomes an impediment to fine pitching.

Patent Document 1: Japanese Unexamined Patent Application, First Publication No. H06-132057

SUMMARY OF THE INVENTION

The exemplary embodiments of the present invention were achieved in view of the above circumstances, and has as their object to provide a wiring substrate that is provided with a fitting portion that can prevent electrical faults between conductive circuits and is compatible with a fine pitch structure without impairing the fitting with a connector.

The wiring substrate according to one aspect of the present invention is a wiring substrate that is provided with a fitting portion for connection with a connector, characterized in that the wiring substrate includes a substrate; a plurality of conductive circuits that are arranged in parallel on one surface of the substrate; an insulating layer that covers the conductive circuits; opening portions that are provided in the insulating layer at the fitting portion and expose at least a portion of the conductive circuits; and a plurality of electrodes that are disposed on the exposed conductive circuits through the opening portion and consist of a conductive member; at least one among the electrodes being disposed so as to cover the exposed portion of the conductive circuit and a portion of the insulating layer in the wiring width direction of the conductive circuit.

The electrode may contain a member that has migration resistance.

Each electrode may cover the entirety of a corresponding opening portion.

Further, the surface of the insulating layer portion that is partially covered by each electrode may have a tapered shape.

Still further, the upper surface of the electrodes may be the same height as or higher than the upper surface of the insulating layer.

Even still further, the electrodes may be disposed in an approximate line when the substrate is viewed in plan view.

Separately, the electrodes may be disposed in a staggered shape when the substrate is viewed in plan view.

According to the wiring substrate of exemplary embodiments of the present invention, it is possible to sufficiently maintain a fitting with a connector. Also, since an insulating layer is provided between conductive circuits, it is possible to suppress electrical faults between adjacent conductive circuits and possible to form a fitting portion with a fine pitching structure.

Figure 1:
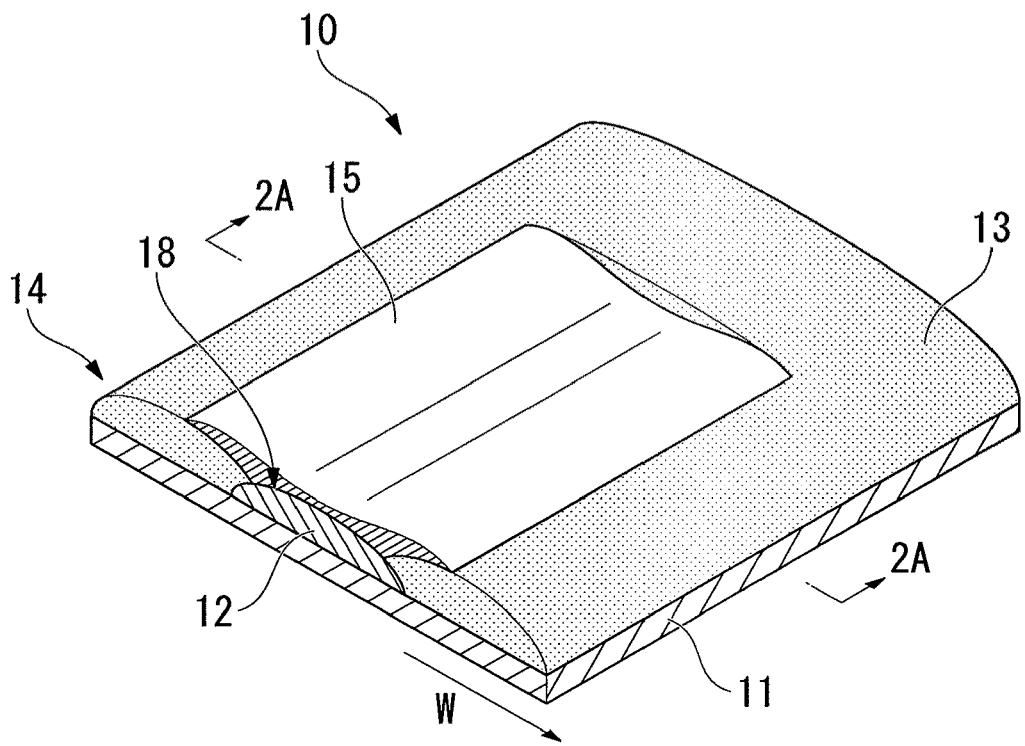
FIG. 1 is a perspective view that shows the wiring substrate of an exemplary embodiment of the present invention.

DESCRIPTION OF THE REFERENCE NUMERALS 10, 30, 91, 101 wiring substrate
11, 24 substrate
11a, 31a surface of substrate
12, 23, 41 (41a, 41b), 51, 83, 92 conductive circuit
92a contact portion of conductive circuit
12a, 83a exposed surface of conductive circuit
13, 22, 33, 43, 53 insulating layer
13a surface of insulating layer
14, 36 fitting portion
15, 35 electrode layer
18, 34 opening portion
42, 52 electrode
86 connector
102 printed circuit portion
105 covering layer

DESCRIPTION OF EXEMPLARY EMBODIMENTS

Figure 2A:
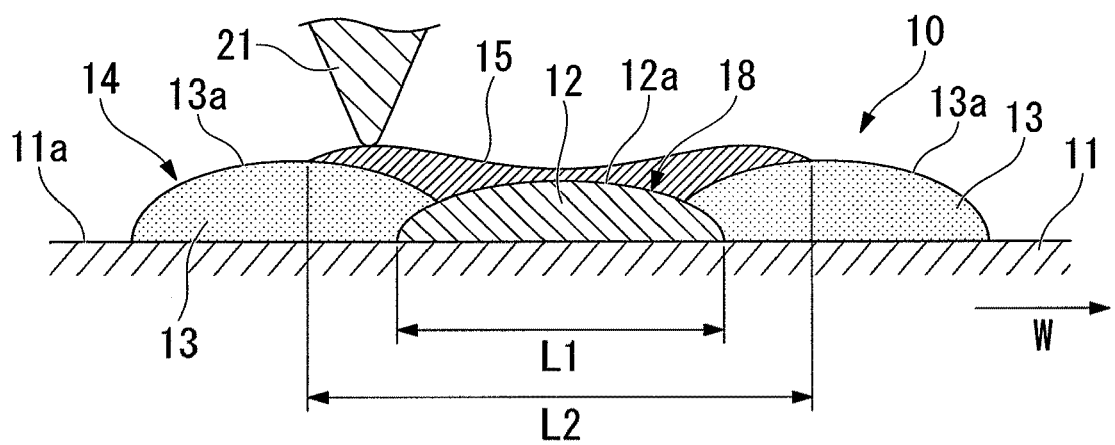
FIG. 2A is a sectional view along line 2A-2A of the wiring substrate shown in FIG. 1.

Hereinbelow, a plurality of exemplary embodiments of the wiring substrate according to the present invention shall be described with reference to the drawings. Note that the present invention is not limited to these exemplary embodiments. FIG. 1 is a perspective view of the fitting portion vicinity in the wiring substrate of one exemplary embodiment of the present invention. FIG. 2A is a sectional view along line 2A-2A of FIG. 1. A wiring substrate 10 of the present exemplary embodiment is provided with a substrate 11, a conductive circuit 12 that is formed on one surface 11a of this substrate 11, and an insulating layer 13 that covers this conductive circuit 12. In this wiring substrate 10, a fitting portion 14 is formed that fits with a connector 21 such as another device.

In the connector portion 14 of this wiring substrate 10, an opening portion 18 is formed that exposes a portion of the conductive circuit 12 so as to partition an individual conductive circuit 12 to the insulating layer 13. In this opening portion 18, a portion of the conductive circuit 12 is exposed from the insulating layer 13 as an exposed surface 12a.

Moreover, on the exposed surface 12a of this conductive circuit 12, an electrode layer 15 that consists of a conductive member is formed. This electrode layer 15 makes contact with the conductive circuit 12 at its lower surface, while the upper surface thereof is extended so as to also cover a portion of the insulating layer 13 in the wiring width direction W of the conductive circuit 12. Thereby, an electrode width L2 in the wiring width direction W of the upper surface of the electrode layer 15 is greater than a wiring width L1 of the conductive circuit 12.

When fine pitching is performed by extreme narrowing of the wiring width (the size of the portions that make contact with the connectors) of the conductive circuits, with merely a slight shift of the fitting location with the connectors, the connectors end up riding onto the insulating layer, leading to a conduction failure as electrical contact with the conductive circuits cannot be made. A need therefore arises to increase the fitting accuracy of the fitting portion with respect to the connectors by fine pitching, which may increase manufacturing cost.

Figure 2B:
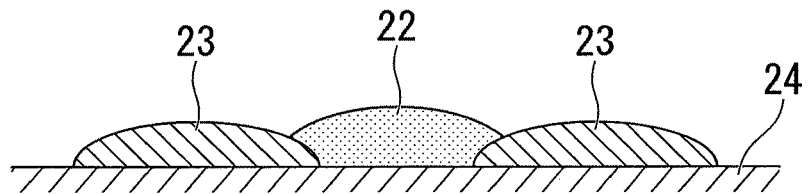
FIG. 2B is a traverse sectional view of the wiring substrate.

However, by adopting the constitution of the present invention as described above, even if the wiring width L1 of the conductive circuit 12 narrows, it is possible to sufficiently ensure the contact points with the connectors by the electrode layer 15 consisting of a conductive member spreading on the conductive circuit 12 so as to also cover a portion of the insulating layer 13. Therefore, even if the fitting with the connector 21 shifts slightly in the wiring width direction W, it is possible to sufficiently ensure conduction between the connector 21 and the conductive circuit 12 via this electrode layer 15. Thereby, it is possible to sufficiently ensure the insulation performance between adjacent conductive circuits 12 and reliably prevent conduction failures due to shifting of the fitting location between the connector 21 and the conductive circuit 12. For that reason, it is possible to perform fine pitching of the conductive circuits 12 of the fitting portion 14 on the wiring substrate 10. Also, as shown in FIG. 2B, a plurality of conductive circuits 23 are opened so as to be individually exposed on a substrate 24, and an insulating layer 22 is formed between the opening portions of the mutually adjacent conductive circuits 23. Thereby, even if the formation interval of the conductive circuits 23 is reduced by fine pitching, it is possible to eliminate electrical malfunctions in the conductive circuits 23.

Note the electrode layer 15 may have a constitution that covers the entire opening portion 18 or only a portion thereof. Also, a surface 13a of the insulating layer 13 at the portion that is partially covered by the electrode layer 15 may be formed in a tapered shape. If the surface 13a of the insulating layer 13 is formed in a tapered shape, when the electrode layer 15 is applied using a conductive paste, it is possible to achieve a flattening of the upper surface of the electrode layer 15 by the conductive paste flowing between adjacent insulating layers 13, and so improve the connectability with the connector.

Also, the upper surface of the electrode layer 15 may be formed so as to be the same height as the upper surface of the insulating layer 13 or higher. Thereby, during attachment and removal of the connector to/from the fitting portion, when the connector hits the upper surface of the insulating layer 13, it is possible to prevent damage to the insulating layer 13 due to scraping of the insulating layer 13, which is formed with a soft material such as resin or the like, and the loss of insulation performance. Also, if the height of the upper surface of the electrode layer 15 is made to be the same height as the upper surface of the insulating layer 13, the fitting with the connector is improved, and so it is possible to more reliably achieve conduction with the connector. Also, if the height of the upper surface of the electrode layer 15 is made to be higher than the height of the upper surface of the insulating layer 13, during insertion/extraction of the connector 21 into/from the fitting portion 14, the connector does not hit the soft insulating layer 13, which proves useful for maintaining the insulation performance by protecting the insulating layer 13.

The substrate 10 may be an electrically insulating substrate made of resin. This kind of substrate 10 constitutes a connection wiring substrate with the connector that is connected to the flexible substrate.

The conductive circuit 12 may be a conductor that includes Ag or Cu from the point of low material cost and low resistance. This conductive circuit 12 may be formed by applying a conductive paste that includes for example Ag or Cu on the substrate 10 in a predetermined pattern. When applying this conductive paste, a method such as screen printing or ink jet printing may be used from the standpoint of lowering cost. The insulating layer 13 may be formed from an insulating resin, such as polyester resin, polyurethane resin, phenol resin, epoxy resin and the like.

This resin with an insulating performance may be printed by a method such as screen printing as an insulating paste that includes a solvent, but is not limited thereto.

The electrode layer 15 may use a material with a conductivity that is as high as possible. If constituted from such a member, even if the distance between the conductive circuit 12 and the connector 21 separates due to a shift of the connector 21, it is possible to enable a low electrical resistance via the electrode layer 15.

As a method of forming the electrode layer 15, it is possible to use both a vacuum process such as the sputtering method or vapor deposition method and a wet type process such as a screen printing method or ink jet printing method.

Concerning the materials that can be used for the electrode layer 15, in relation to formation with the vacuum process, it is possible to use all metal materials. However, in the case of coating with a method such as a printing method, it is limited to a low-resistance material, such as a silver paste or gold paste. In relation to a low cost and large surface area, a printing method is advantageous.

Also, as the constituent members of the electrode layer 15, a migration resistant material that is effective in suppressing migration may be used. As a migration resistant material, a material that contains little or no copper or silver components may be used. Moreover, a material that is capable of being printed may be used in order to lower costs, including for example, a conductive paste that consists of Ni particulates and a resin component, a conductive paste that contains gold-plated particulates and a resin component, and a carbon paste or soldering paste. By constituting the electrode layer 15 with such a migration resistant material, it is possible to suppress the occurrence of migration even when using a material such as Ag and Cu that has excellent conductivity and in which migration occurs easily as the conductive circuit 12.

Figure 3A:
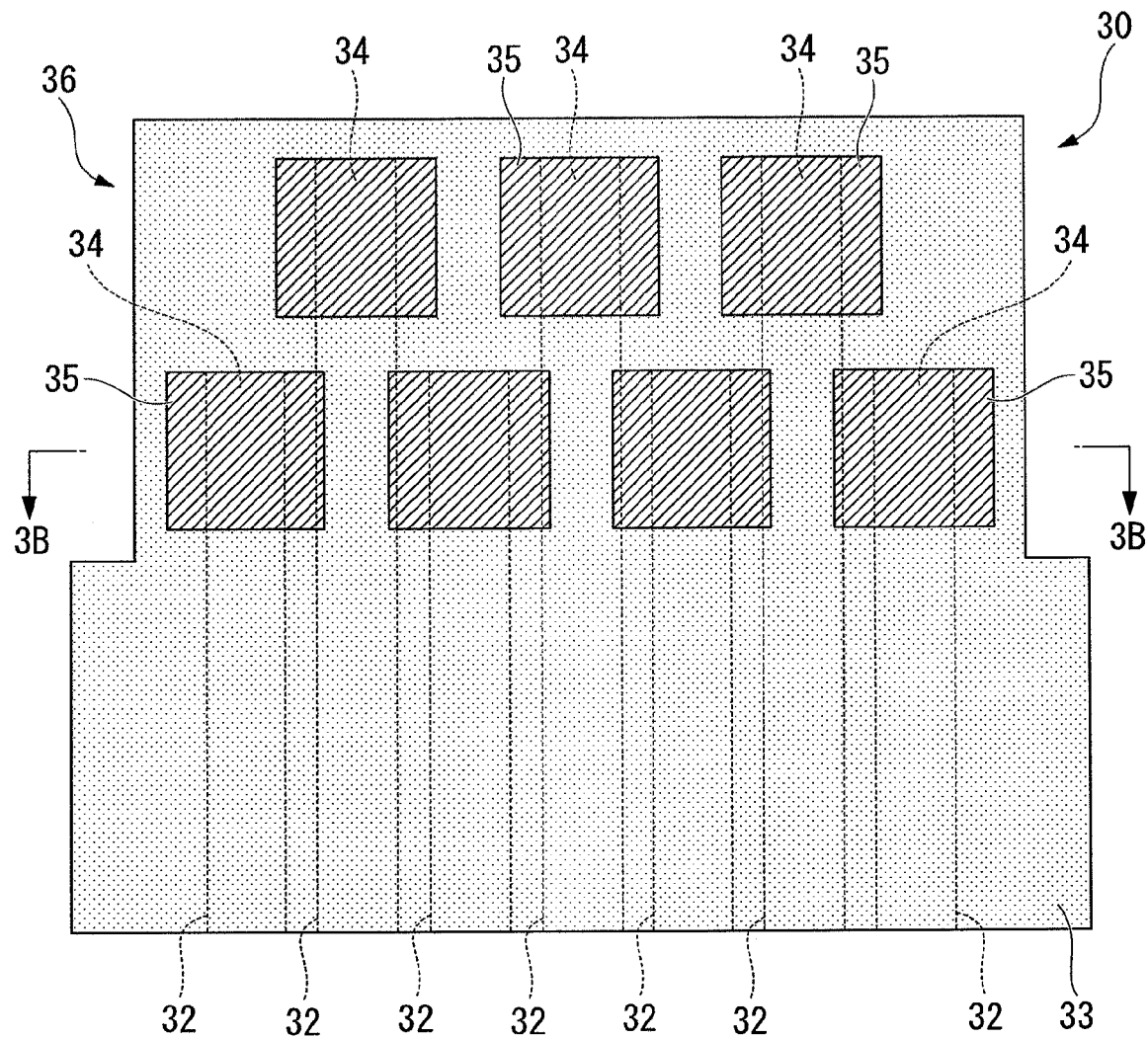
FIG. 3A is a plan view of the wiring substrate of an exemplary embodiment of the present invention.
Figure 3B:
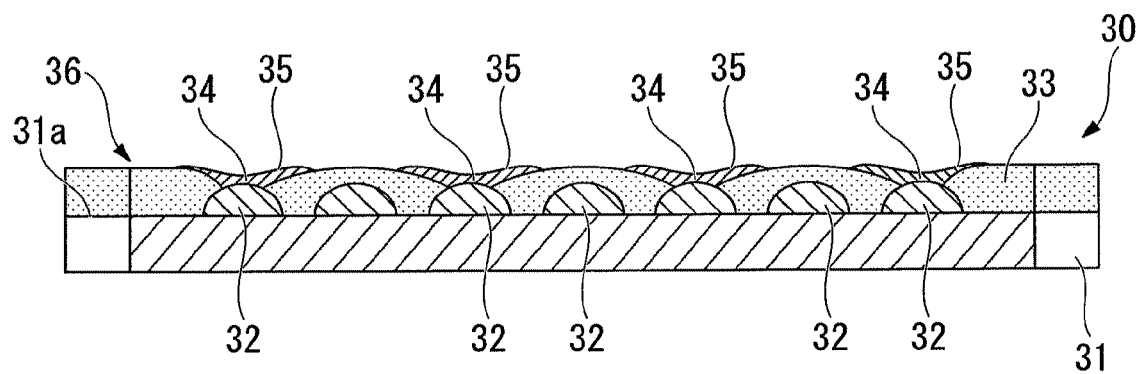
FIG. 3B is a sectional view along line 3B-3B of the wiring substrate shown in FIG. 3A.

FIG. 3A and FIG. 3B are drawings that show the first exemplary embodiment of the wiring substrate of the present invention. In this exemplary embodiment, by shifting the opening portions of mutually adjacent conductive circuits to make a staggered arrangement, fine pitching of the conductive circuits is achieved in the fitting portion. Conductive circuits 32 that are formed in parallel on a surface 31a of a substrate 31 that constitutes a wiring substrate 30 are covered by an insulating layer 33. Opening portions 34 that expose the respective conductive circuits 32 are formed in a staggered arrangement. An electrode layer 35 that consists of a conductive member is formed on the conductive circuit 32 that is exposed from the opening portion 34. This electrode layer 35 extends so as to also cover a portion of the insulating layer 33.

According to this constitution, since the electrode layers 35 have a staggered arrangement and are formed by being mutually shifted, even if the wiring interval of the conductive circuits 32 is further narrowed, since there is no interference between the mutually adjacent electrode layers 35, it is possible to achieve further fine pitching of the conductive circuits 32 in a fitting portion 36 of the wiring substrate 30, and even if a shift in the fitting position with the connector occurs in the wiring width direction, it is possible to reliably obtain an electrical connection by preventing conduction failures.

Figure 4A:
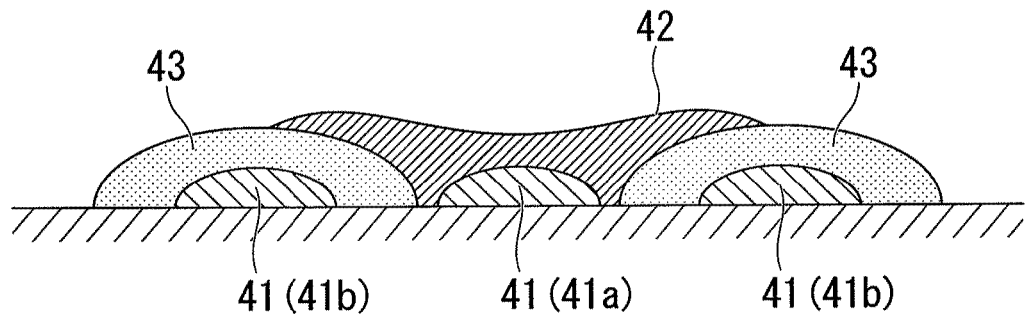
FIG. 4A is a sectional view that shows another exemplary embodiment of the wiring substrate according to the present invention.

FIG. 4A is a cross-sectional view that shows another exemplary embodiment of the wiring substrate of the present invention. This exemplary embodiment shows the wiring substrate such that the positions of adjacent electrodes 42 are arranged by being shifted. A conductive circuit 41 (41a) at the portion in which the electrode 42 is formed has a constitution in which its surface is covered with the electrode 42 without being covered by an insulating layer 43 between the adjacent conductive circuits 41 (41b) that are covered by the insulating layer 43. In this kind of constitution, even if a shift in the fitting position with the connector occurs in the wiring width direction, it is possible to reliably obtain an electrical connection by preventing conduction failures.

Figure 4B:
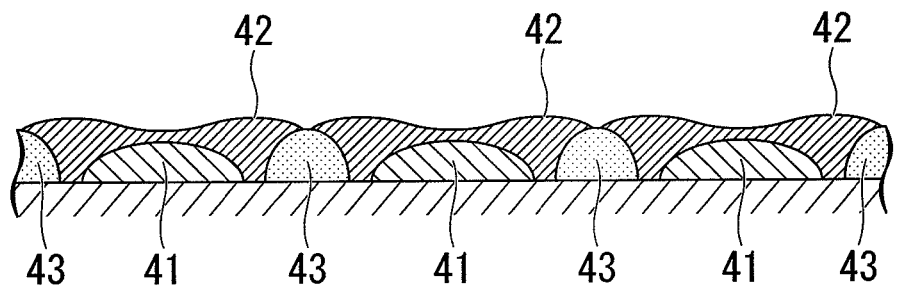
FIG. 4B is a sectional view that shows a separate exemplary embodiment of the wiring substrate according to the present invention.

Note that as shown in FIG. 4B, a structure is also possible in which the opening portions are arranged in an approximate line without being arranged in a staggered shape.

Figure 4C:
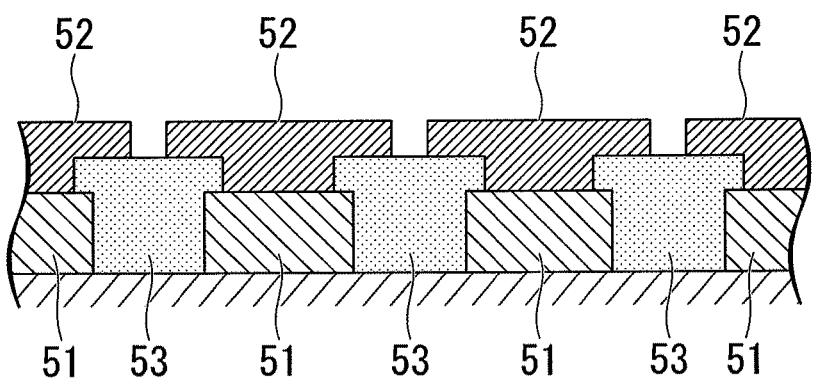
FIG. 4C is a sectional view that shows yet another exemplary embodiment of the wiring substrate according to the present invention.
Figure 4D:
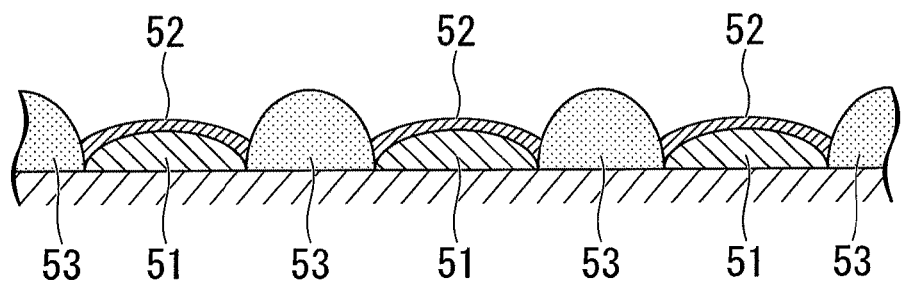
FIG. 4D is a sectional view that shows still yet another exemplary embodiment of the wiring substrate according to the present invention.

Also, as shown in FIG. 4C and FIG. 4D, a structure is also possible in which electrodes 52 are formed so as to overhang to the right and left on each conductive circuit 51, and insulating layers 53 are formed so as to completely bury the circuit space between the conductive circuits 51.

EXAMPLES

Figure 6:
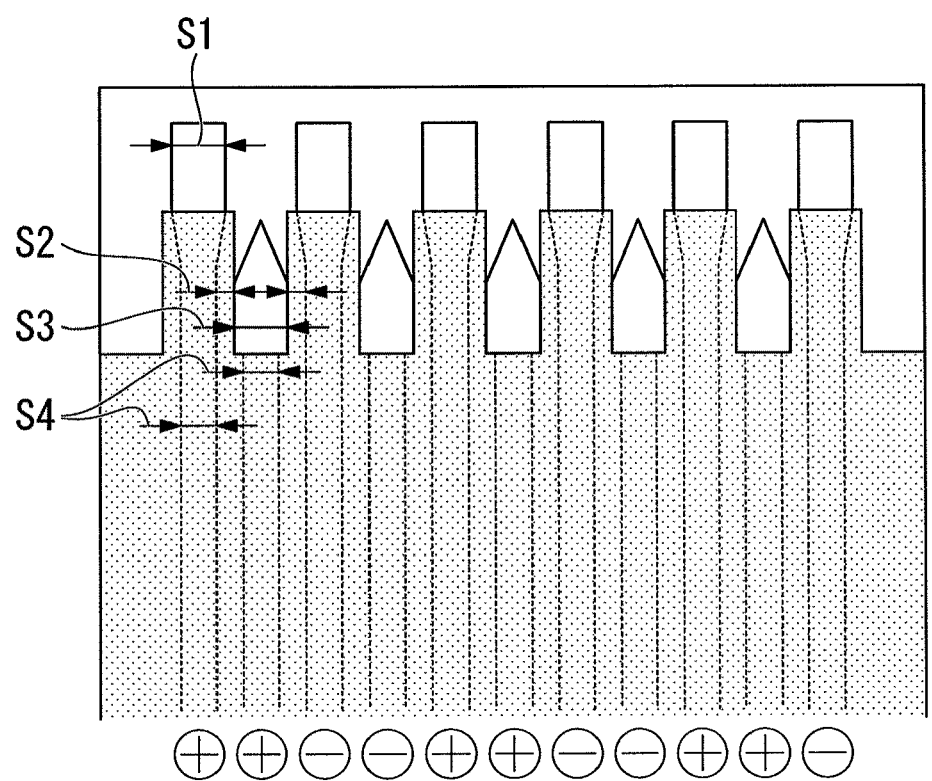
FIG. 6 is a plan view that shows the wiring substrate of another exemplary embodiment of the present invention.

The effect relating to the insulating performance by fine pitching of the wiring substrate was investigated. In the investigation, as Example 1 of the present invention, a wiring substrate was prepared with a constitution of exposed surfaces of mutually adjacent conductive circuits forming a staggered arrangement, with the insulating layer extended for the conductive circuits of one side and an electrode layer not being provided as shown in FIG. 6. Also, two levels of the wiring interval D were made by changing the wiring width W, and the superiority in the case of the interval being narrowed was compared.

Figure 5:
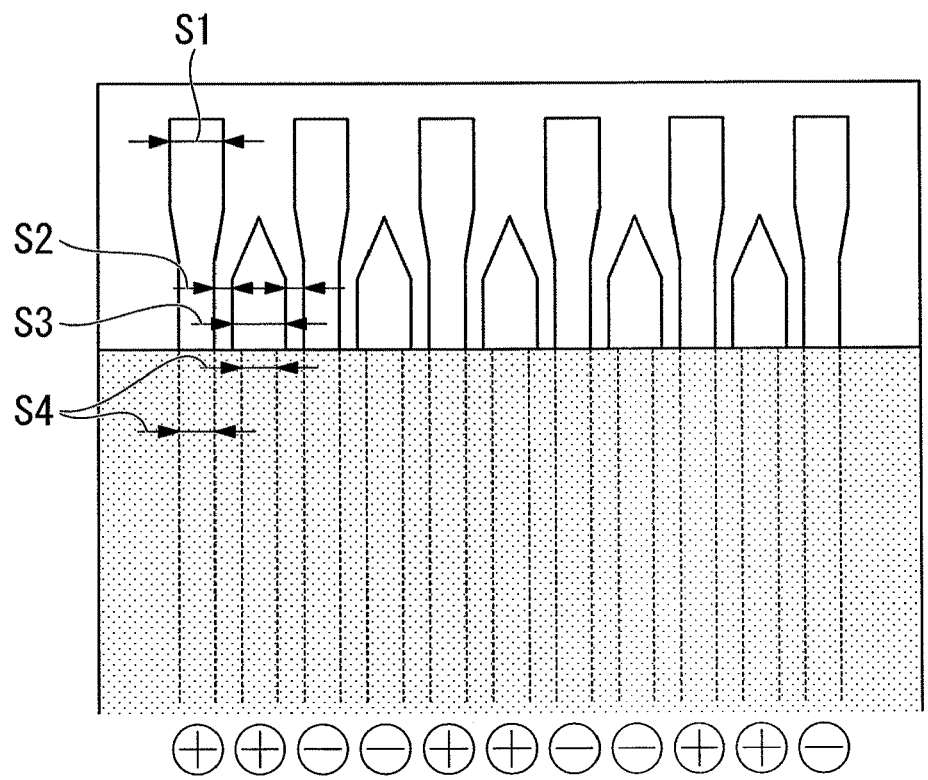
FIG. 5 is a plan view that shows the wiring substrate of the comparative example.

As the comparative example, as shown in FIG. 5, a wiring substrate was prepared in which exposed surfaces of mutually adjacent conductive circuits form a staggered arrangement and the entire end portions of the conductive circuits are exposed without forming an insulating layer on the fitting portion and not providing an electrode layer. Therein, one in which the wiring interval D of the conductive circuits is 50 to 70 μm serves as Comparative Example 1, and one with a wiring interval of 100 μm serves as Comparative Example 2. Also, a silver paste was used for the conductive layer on all of the Example 1, Comparative Example 1, and Comparative Example 2. As the silver paste, XA3060 (product name, manufactured by Fujikura Kasei) was used.

Figure 7:
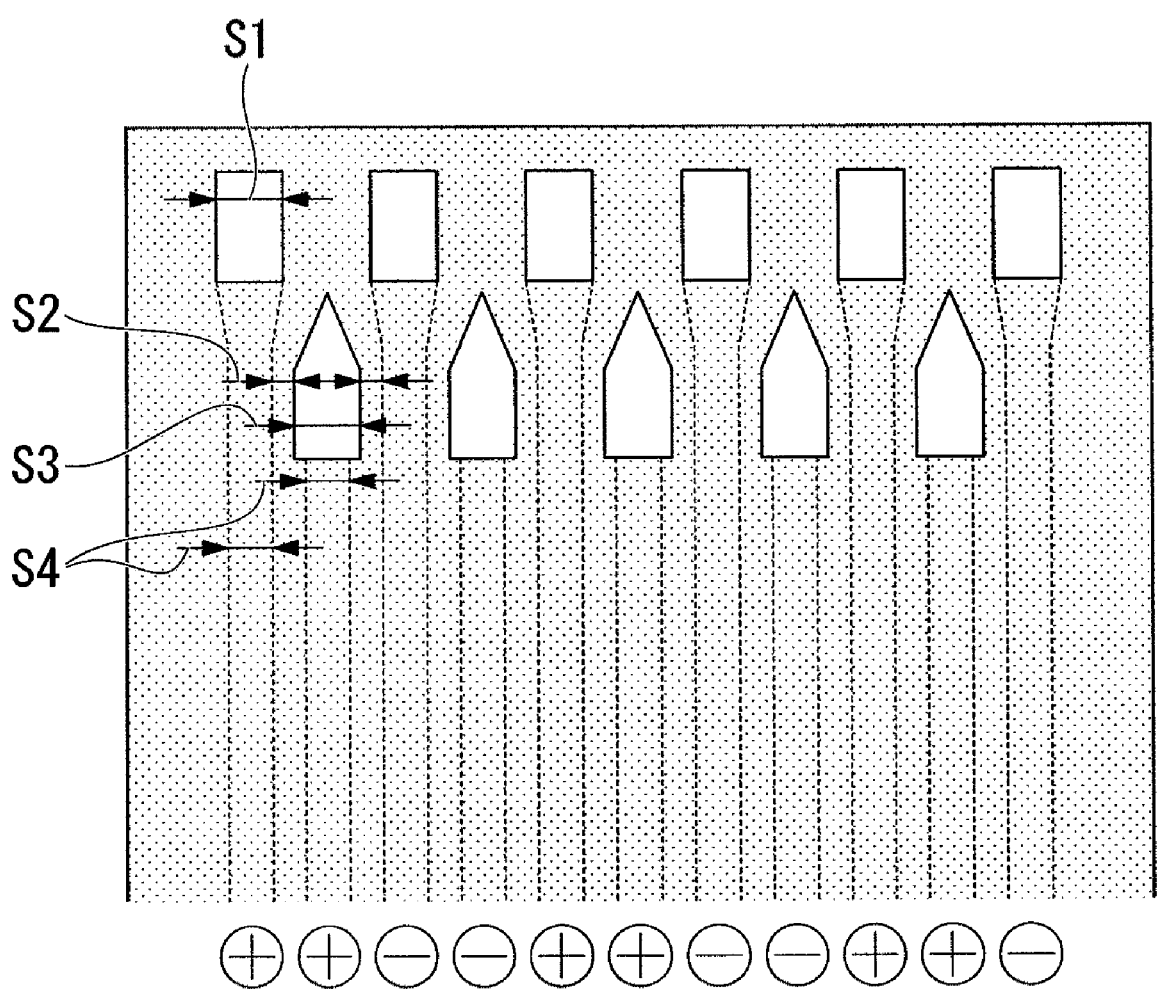
FIG. 7 is a plan view that shows the wiring substrate of another exemplary embodiment of the present invention.
Figure 8A:
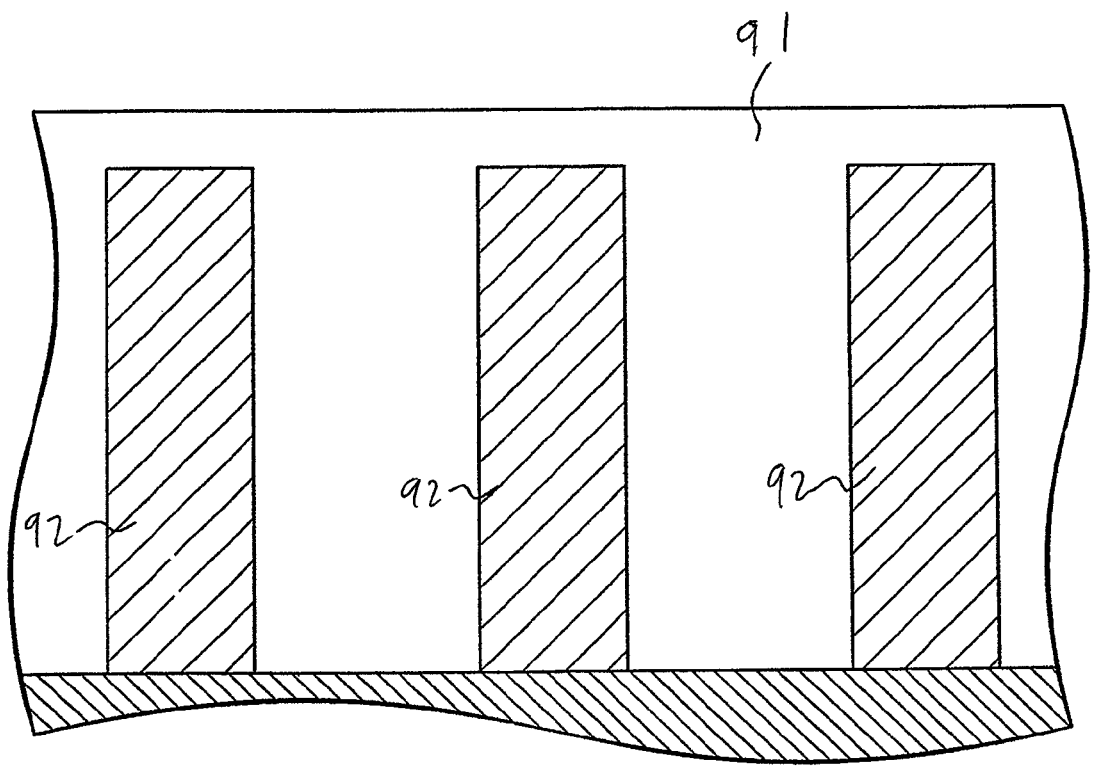
FIG. 8A is a main portion plan view that shows an example of a conventional wiring substrate.
Figure 8B:
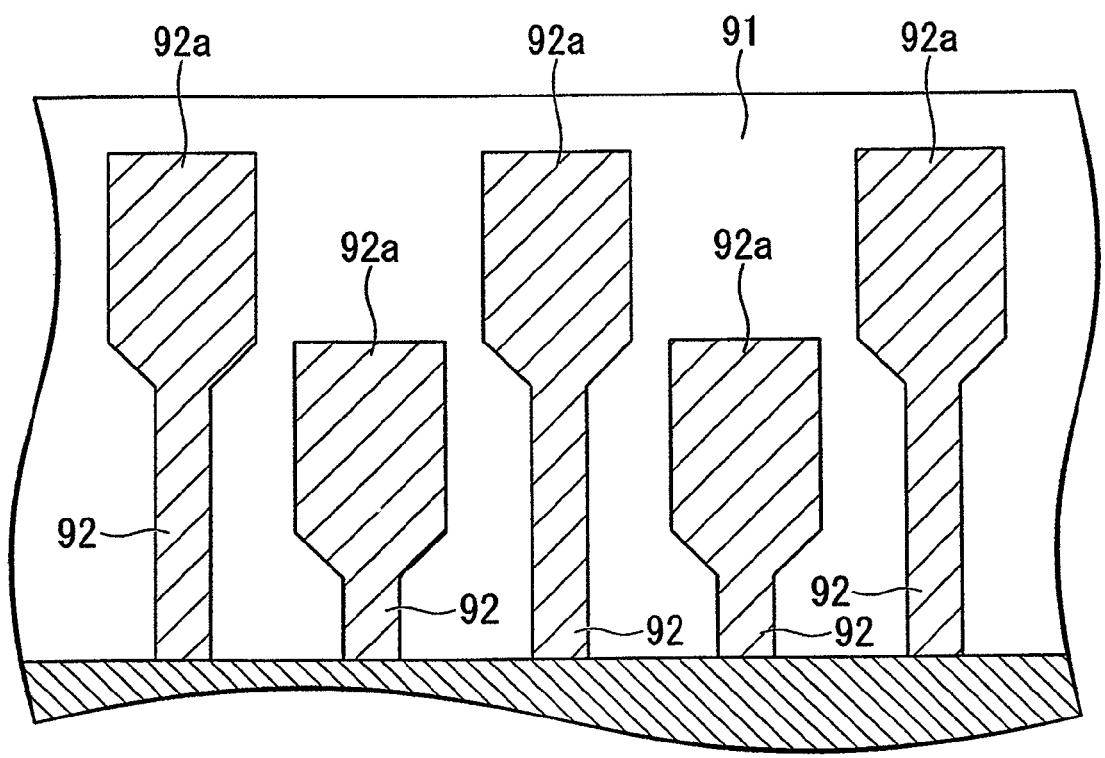
FIG. 8B is a main portion plan view that shows another example of a conventional wiring substrate.
Figure 9:
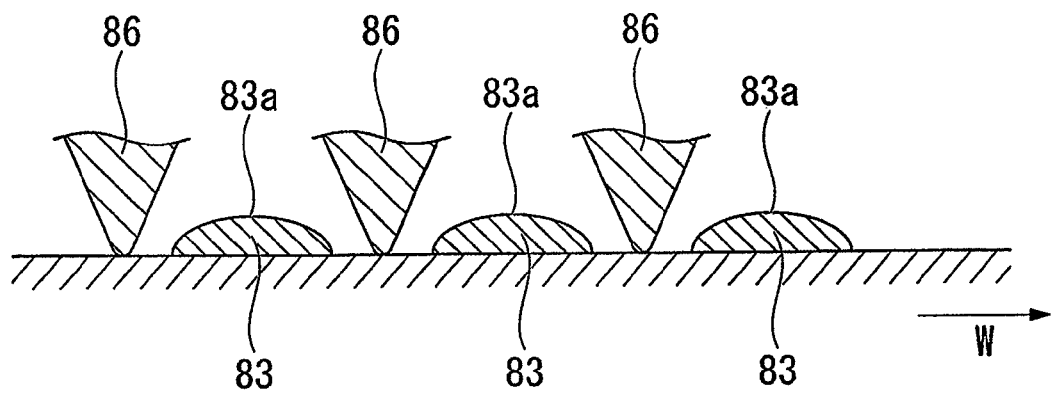
FIG. 9 is a sectional view that shows a separate example of a conventional wiring substrate.
Figure 10:
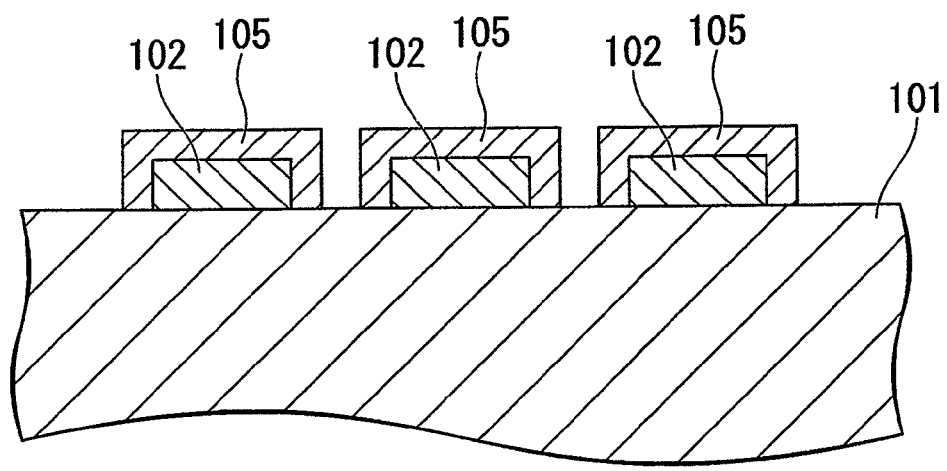
FIG. 10 is a sectional view that shows yet another example of a conventional wiring substrate.

The formation dimensions of each portion of the conductive circuit in FIGS. 5 to 7 are as given below.

S1=300 μm
S2 (wiring interval D)=50 to 70 μm (Examples 1 to 5, Comparative Example 1), 100 μm (Comparative Example 2)
S3=300 μm
S4 (wiring width W)=S1−S2×2 μm
wiring thickness=200 μm Then, the wiring substrate of Example 1, and the respective wiring substrates of Comparative Example 1 and Comparative Example 2 were impressed with a 5V voltage with the polarity shown in each drawing in an environment of a temperature of 60° C. and humidity of 95%. Then, after 240 hours and 1,000 hours, among 10 samples of each, those in which adjacent wiring substrates electrically shorted were inspected. The investigation results are presented in Table 1.

TABLE 1

| Sample | Corresponding Drawing | Smallest Wiring Interval | Evaluation (Non-defective No./Examined No.) After 240 Hours | After 1,000 Hours | Material (Electrode Layer 12) | Material (Electrode Layer 15) |
|---|---|---|---|---|---|---|
| Comparative Example 1 | FIG. 5 | 50~70 | (0/10) | (0/10) | Silver Paste | — |
| Comparative Example 2 | FIG. 5 | 100 | (7/10) | (0/10) | Same | — |
| Example 1 | FIG. 6 | 50~70 | (10/10) | (5/10) | Same | — |
| Example 2 | FIG. 7 | 50~70 | (10/10) | (7/10) | Same | Silver Paste |
| Example 3 | FIG. 7 | 50~70 | (10/10) | (9/10) | Same | Copper Paste |
| Example 4 | FIG. 7 | 50~70 | (10/10) | (10/10) | Same | Ni Paste |
| Example 5 | FIG. 7 | 50~70 | (10/10) | (10/10) | Same | Au-plated Ni Paste |

As is evident from the inspection result shown in Table 1, in the Comparative Example 2 that sets the wiring interval at 100 μm, at the point at which 240 hours have elapsed, three of the 10 samples short-circuited, and after the passage of 1,000 hours, all 10 short-circuited. Also, in the Comparative Example 1 with a wiring interval of 50 to 70 μm, after the passage of 240 hours, all 10 short-circuited.

In the wiring substrate of Example 1, even with a wiring interval of 50 to 70 μm, at the point when 240 hours have elapsed, the insulating property is maintained with none of the 10 samples short-circuiting. Also, even after 1,000 hours have elapsed, only five have short-circuited, and at least half have maintained their insulating property. Therefore, in the fitting portion with the connector, if the insulating layer is arranged between adjacent conductive circuits and the electrode layer is formed on the exposed conductive circuits as in this constitution, since is possible to sufficiently maintain the fitting with the connector and it is possible to suppress defects between adjacent conductive circuits, it is possible to form a fitting portion with a fine-pitched structure.

Also, as separate examples of the present invention, as shown in FIG. 7, wiring substrates were prepared that cover all the conductive circuits with an insulating layer and form opening portions in the insulating layer so that exposed surfaces of mutually adjacent conductive circuits form a staggered arrangement and provide the electrode layer on the exposed conductive circuits. Then, an Example 2 that makes the material of the conductive layer silver paste (XA3060 (product name, manufactured by Fujikura Kasei)), and uses silver paste (XA3060 (product name, manufactured by Fujikura Kasei Co., Ltd.)) also for the electrode layer, an Example 3 that uses copper paste (NF2000 (product name: Tatsuta System Electronics)), an Example 4 that uses Ni paste (Namix), and an Example 5 that uses Au-plated Ni paste are prepared. Among these, Au-plated Ni paste is made into a paste by using conductive particulates 85 that consist of a thin gold plate around an Ni particulate, a phenol epoxy resin 15, and a carbitol acetate solution. Also, the formation dimensions of each portion in FIG. 7 are the same as in FIGS. 4A-4D, discussed above. Note that, in FIG. 7, the illustration of the electrode layer is omitted in order to simplify comprehension of the dimensions of the opening portion.

For these Examples 2 to 5, according to the investigation results shown in Table 1, in the case of forming the electrode layer with any material, the insulating performance was maintained without short circuiting in the 10 samples after the passage of 240 hours.

Also, even after the passage of 1,000 hours, at the most only three of 10 samples short-circuited. Also, for those that used Ni paste or Au-plated Ni paste that have excellent migration resistance for the electrode layer, none of the 10 samples short-circuited.

According to the wiring substrate of above-described exemplary embodiments of the present invention, even when the interval of the conductive circuits narrows, the insulating performance is sufficient, so fine pitching of the conductive circuits is possible. It was confirmed that the insulating performance is significantly improved. Note that the effect of the present invention is not limited to the wiring substrate of the shape shown in FIG. 6 and FIG. 7, or any of the other exemplary embodiments herein described.

What is claimed is:

1. A wiring substrate that is provided with a fitting portion for connection with a connector, the wiring substrate comprising:
    a substrate;
    a plurality of conductive circuits that are arranged in parallel on one surface of the substrate;
    an insulating layer that covers the conductive circuits;
    opening portions that are provided in the insulating layer at the fitting portion and expose at least a portion of the conductive circuits; and
    a plurality of electrodes that are disposed on the exposed conductive circuits through the opening portion and consist of a conductive member;
    at least one among the electrodes being disposed so as to cover the exposed portion of the conductive circuit and a portion of the insulating layer in the wiring width direction of the conductive circuit;
    wherein the surface of the insulating layer portion that is partially covered by each electrode has a tapered shape, and
    an upper surface of the at least one among the electrodes is recessed.

2. The wiring substrate of claim 1, wherein the electrode includes a member that has migration resistance.

3. The wiring substrate of claim 2, wherein the member that has migration resistance contains no silver or copper.

4. The wiring substrate of claim 2, wherein the member that has migration resistance is capable of being printed.

5. The wiring substrate of claim 1, wherein each electrode covers the entirety of a corresponding opening portion.

6. The wiring substrate of claim 1, wherein the upper surface of the electrodes is the same height as or higher than the upper surface of the insulating layer.

7. The wiring substrate of claim 1, wherein the electrodes are disposed in an approximate line when the substrate is views in plan view.

8. The wiring substrate of claim 1, wherein the electrodes are disposed in a staggered shape when the substrate is viewed in plan view.

9. The wiring substrate of claim 1, wherein the electrodes are formed to overhang around the edges of the exposed conductive circuits.

10. The wiring substrate of claim 1, wherein the width of at least one electrode in the wiring width direction of the upper surface of the electrode layer is greater than a wiring width of the corresponding conductive circuit.

11. The wiring substrate of claim 1, wherein the opening portions are formed such that a plurality of the conductive circuits are individually exposed.

12. The wiring substrate of claim 11, wherein a second insulating layer is formed between the opening portions of mutually adjacent conductive circuits.

13. The wiring substrate of claim 1, wherein the insulating layer comprises an insulating resin.

14. The wiring substrate of claim 13, wherein the insulating resin comprises at least one of polyester resin, polyurethane resin, phenol resin, and epoxy resin.

15. The wiring substrate of claim 1, further comprising a second insulating layer formed on the conductive circuits adjacent to each conductive circuit corresponding to an electrode.

16. A wiring substrate, comprising:
   a substrate;
   at least one conductive circuit arranged on a surface of the substrate;
   an insulating layer that covers the conductive circuit;
   an opening portion provided in the insulating layer, wherein the opening portion exposes at least a portion of the conductive circuit; and
   an electrode that is disposed on the exposed conductive circuit through the opening portion;
   wherein the electrode is disposed to cover at least part of the exposed portion of the conductive circuit and a portion of the insulating layer in the wiring width direction of the conductive circuit, and
   wherein the surface of the insulating layer that is partially covered by the electrode has a tapered shape, and
   an upper surface of the electrodes is recessed.

* * * * *